United States Patent
Di et al.

(10) Patent No.: US 11,979,136 B2
(45) Date of Patent: May 7, 2024

(54) AIR GAP TYPE SEMICONDUCTOR DEVICE PACKAGE STRUCTURE

(71) Applicant: Ningbo Semiconductor International Corporation, Ningbo (CN)

(72) Inventors: Yunxiang Di, Ningbo (CN); Mengbin Liu, Ningbo (CN); Situo Xu, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 0 days.

(21) Appl. No.: 18/199,655

(22) Filed: May 19, 2023

(65) Prior Publication Data

US 2023/0291379 A1    Sep. 14, 2023

Related U.S. Application Data

(60) Division of application No. 16/686,452, filed on Nov. 18, 2019, now Pat. No. 11,695,387, which is a
(Continued)

(30) Foreign Application Priority Data

May 16, 2019    (CN) .......................... 201910407140.3

(51) Int. Cl.
  *H03H 9/02*    (2006.01)
  *H01L 21/56*    (2006.01)
  (Continued)

(52) U.S. Cl.
  CPC ......... *H03H 9/02535* (2013.01); *H01L 21/56* (2013.01); *H01L 23/28* (2013.01);
  (Continued)

(58) Field of Classification Search
  CPC ........ H03H 9/00; H03H 9/02; H03H 9/02535; H03H 3/08; H03H 9/64; H03H 9/06;
  (Continued)

(56) References Cited

U.S. PATENT DOCUMENTS 7,528,522 B2 *    5/2009    Masuko ............... H03H 9/1085
                                        310/313 R
10,333,493 B2    6/2019    Nagarkar et al.
(Continued)

FOREIGN PATENT DOCUMENTS

| CN | 106301283 A | 1/2017 |
| CN | 106888002 A | 6/2017 |

(Continued)

*Primary Examiner* — Hai L Nguyen (74) *Attorney, Agent, or Firm* — Anova Law Group, PLLC (57) ABSTRACT

A package structure of an air gap type semiconductor device includes a carrier; a semiconductor chip; and a bonding layer disposed between the carrier and the semiconductor chip. A first cavity is formed in the bonding layer and enclosed by the semiconductor chip and the carrier to at least aligned with a portion of an active region of the semiconductor chip. An encapsulation layer and the bonding layer are on a same side of the carrier to encapsulate the semiconductor chip and an exposed region of the bonding layer. At least one portion of the encapsulation layer is formed between the semiconductor chip and the carrier along a direction perpendicular to a lateral surface of the carrier. Interconnection structures formed on a side of the carrier different from a side with the
(Continued)

bonding layer. Each interconnection structure is electrically connected to a corresponding input/output electrode of the semiconductor chip.

16 Claims, 9 Drawing Sheets

Related U.S. Application Data continuation of application No. PCT/CN2019/099557, filed on Aug. 7, 2019.

(51) Int. Cl.
- *H01L 23/28* (2006.01)
- *H01L 23/482* (2006.01)
- *H01L 23/522* (2006.01)
- *H01L 23/66* (2006.01)
- *H03H 3/08* (2006.01)
- *H03H 9/64* (2006.01)

(52) U.S. Cl.
CPC ........ *H01L 23/482* (2013.01); *H01L 23/5226* (2013.01); *H01L 23/66* (2013.01); *H03H 3/08* (2013.01); *H03H 9/64* (2013.01)

(58) Field of Classification Search
CPC ....... H01L 21/56; H01L 23/28; H01L 23/482; H01L 23/6226; H01L 23/66
See application file for complete search history.

(56) References Cited

U.S. PATENT DOCUMENTS

| | | | |
|---|---|---|---|
| 11,695,387 B2 * | 7/2023 | Di | .......... H01L 23/315 333/193 |
| 2005/0006987 A1 | 1/2005 | Masuko et al. | |

FOREIGN PATENT DOCUMENTS

| CN | 107786183 A | 3/2018 |
|---|---|---|
| CN | 109560789 A | 4/2019 |
| JP | 2009213174 A | 9/2009 |
| JP | 2011159882 A | 8/2011 |
| JP | 2012109925 A | 6/2012 |
| JP | 2018074566 A | 5/2018 |

* cited by examiner

FIG. 1

```
┌─────────────────────────────────────────────────────────────────────┐
│  Providing a carrier and a semiconductor chip, forming a bonding    │
│  layer on the carrier, and forming a first opening in the bonding   │──S01
│  layer, where the semiconductor chip includes an active region and  │
│  input/output electrode regions                                     │
└─────────────────────────────────────────────────────────────────────┘
                                    │
                                    ▼
┌─────────────────────────────────────────────────────────────────────┐
│  Disposing the semiconductor chip on the bonding layer, thereby     │
│  forming a first cavity at the first opening by the semiconductor   │──S02
│  chip and the carrier, where the first cavity is at least aligned   │
│  with a portion of the active region of the semiconductor chip      │
└─────────────────────────────────────────────────────────────────────┘
                                    │
                                    ▼
┌─────────────────────────────────────────────────────────────────────┐
│  Performing an encapsulation process on a side of the carrier with  │──S03
│  the bonding layer, such that the semiconductor chip is encapsulated│
│  on the carrier                                                     │
└─────────────────────────────────────────────────────────────────────┘
                                    │
                                    ▼
┌─────────────────────────────────────────────────────────────────────┐
│  Forming through holes passing through the carrier, where each      │──S04
│  through hole is at least aligned with a portion of the             │
│  input/output electrode regions                                     │
└─────────────────────────────────────────────────────────────────────┘
                                    │
                                    ▼
┌─────────────────────────────────────────────────────────────────────┐
│  Forming interconnection structures on a side of the carrier        │
│  different from the side with the bonding layer, where each         │──S05
│  interconnection structure passes through a corresponding through   │
│  hole and is electrically connected to a corresponding input/output │
│  electrode in the input/output electrode regions                    │
└─────────────────────────────────────────────────────────────────────┘
```

AIR GAP TYPE SEMICONDUCTOR DEVICE PACKAGE STRUCTURE

CROSS-REFERENCE TO RELATED APPLICATIONS

This application is a divisional of U.S. patent application Ser. No. 16/686,452, filed on Nov. 18, 2019, now U.S. Pat. No. 11,695,387 B2 issued on Jul. 4, 2023, which is a continuation application of PCT Patent Application No. PCT/CN2019/099557, filed on Aug. 7, 2019, which claims priority to Chinese patent application No. 201910407140.3, filed on May 16, 2019, the entirety of all of which is incorporated herein by reference.

FIELD OF THE DISCLOSURE

The present disclosure generally relates to the field of semiconductor manufacturing, and more particularly, relates to an air gap type semiconductor device package structure.

BACKGROUND

In semiconductor devices, cavity environment may need to be provided by active regions of certain devices to ensure normal operations, and air gaps may need to be formed in device active regions during fabrication or packaging of the devices such as filters, microelectromechanical systems (MEMS) devices, and the like.

Taking a surface acoustic wave (SAW) filter as an example, the SAW is an abbreviation for the surface acoustic wave, which is an elastic wave that may be generated on the surface of a piezoelectric solid material and may have a propagation amplitude rapidly decreasing as the depth of the solid material increases. As a common electronic component, the SAW filter may have a function of allowing signals of certain frequencies to pass smoothly, and of suppressing signals of the other portion of frequencies, and may be widely used in base stations and repeaters of television, satellite communication, optical fiber communication, mobile communications, mobile phones, the global positioning system (GPS), electronic countermeasures, radars, and the like. With the development of filter packaging technology, the SAW filter may also be rapidly evolving toward high performance, small size, light weight and low cost.

Figure 1:
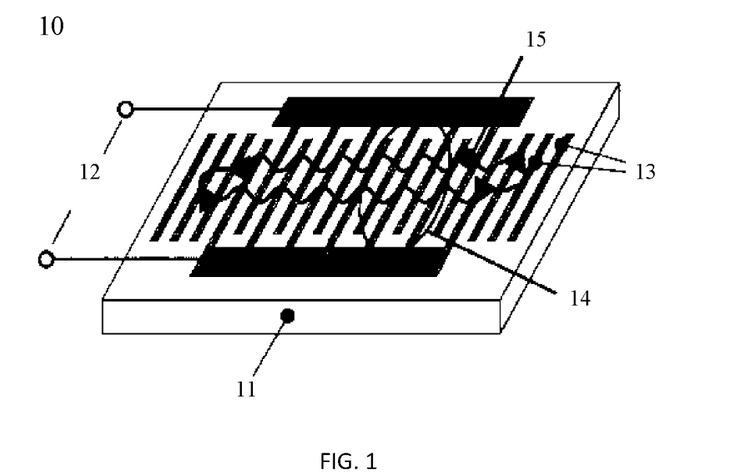
FIG. 1 illustrates a structural schematic of a surface acoustic wave (SAW) filter.

As shown in FIG. 1, in a SAW filter 10, an electrical input signal may be supplied to the inside of the SAW filter through a port (I/O contact) 12, where the electrical input signal may be converted into an acoustic wave 15 by an interdigital transducer (IDT) 14 composed of cross-arranged metal electrodes 13 on a piezoelectric substrate 11. The acoustic wave 15 may mainly propagate along a surface of the piezoelectric substrate 11 and surfaces of the protruded interdigital electrodes, which is called as the surface acoustic wave. The region where the interdigital transducer is located may be the active region of the SAW filter chip. In the packaging process of the SAW filter, a cavity may need to be formed surrounding the active region to ensure generation and propagation of the acoustic wave.

Currently, the packaging technology of the SAW filter may mainly be metal packaging, plastic packaging, and surface mount packaging. A base and an upper cover may at least be used in the above-mentioned packaging processes of the SAW filter, that is, a SAW filter chip may be attached on the base and then sealed by the upper cover. The SAW filter using the metal and plastic packaging technologies may have relatively long pins, resulting in a large-sized device. With the surface mount packaging technology, although the application range is wide, the fabrication process may be complicated, and ceramic materials such as high temperature co-fired ceramics (HTCC) and low temperature co-fired ceramics (LTCC) may be expensive. Therefore, there is a need to develop a filter packaging method with small packaging size, simple fabrication, and low cost.

BRIEF SUMMARY OF THE DISCLOSURE

The present disclosure provides a method for fabricating an air gap type semiconductor device package structure, which aims to reduce package volume, simplify fabrication process and reduce production cost.

One aspect of the present disclosure provides an air gap type semiconductor device package structure. The package structure of the air gap type semiconductor device includes a carrier; a semiconductor chip; and a bonding layer disposed between the carrier and the semiconductor chip. A first cavity is formed in the bonding layer and enclosed by the semiconductor chip and the carrier to at least aligned with a portion of an active region of the semiconductor chip. An encapsulation layer and the bonding layer are on a same side of the carrier to encapsulate the semiconductor chip and an exposed region of the bonding layer. At least one portion of the encapsulation layer is formed between the semiconductor chip and the carrier along a direction perpendicular to a lateral surface of the carrier. At least one through hole passes through the carrier, and at least exposes a portion of the input/output electrode regions. Interconnection structures are formed on a side of the carrier different from a side with the bonding layer. Each interconnection structure passes through a corresponding through hole and is electrically connected to a corresponding input/output electrode in the input/output electrode regions.

Another aspect of the present disclosure provides a package structure of an air gap type semiconductor device, including: a carrier, a semiconductor chip, and a bonding layer between the carrier and the semiconductor chip. A first cavity and a second cavity are provided in the bonding layer and each between the carrier and the semiconductor chip, the first cavity is at least aligned with a portion of an active region of the semiconductor chip, and the second cavity is at least aligned with a portion of an input/output electrode region. An encapsulation layer encapsulates the semiconductor chip on the carrier, a through hole passes through the carrier and connects to the second cavity; and an interconnection structure is formed in the through hole and the second cavity, and connected to the input/output electrode region.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIGS. 8A-11A illustrate top views of examples of semiconductor structures each having a semiconductor chip on a bonding layer of a carrier (not shown) at a certain stage during fabrication of an air gap type semiconductor device package structure according to various disclosed embodiments of the present disclosure;

FIGS. 8B-11B illustrate cross-sectional structural schematics of the semiconductor structures in FIGS. 8A-11A;

DETAILED DESCRIPTION

An air gap type semiconductor device package structure and its fabrication method of the present disclosure may be further described in detail with reference to the accompanying drawings and specific embodiments hereinafter. The advantages and features of the present disclosure may be more apparent according to the following description and the accompanying drawings. However, it should be noted that the concept of the technical solution of the present disclosure may be implemented in various different forms and may not be limited to specific embodiments set forth herein. The accompanying drawings may be all in simplified forms and non-precise scales and may be merely for convenience and clarity of the purpose of the embodiments of the present disclosure.

The terms "first", "second" and the like in the specification and the claims may be used to distinguish similar elements and may be not necessarily used to describe a particular order or chronological order. It should be understood that the used terms may be substituted, as appropriate. For example, the embodiments described herein of the present disclosure may be enabled to operate in other sequences than sequences described or illustrated herein. Similarly, if the method described herein comprise a series of steps, the order of the steps presented herein may not be necessarily the only order in which the steps may be performed, and some of the steps may be omitted and/or other steps, which are not described herein, may be added to the method. If components in one of the drawings are same as components in other drawings, although the components may be easily recognized in all drawings, labels of all the same components may not be marked in each figure in the present specification in order to make the description of the drawings clearer.

Figure 2:
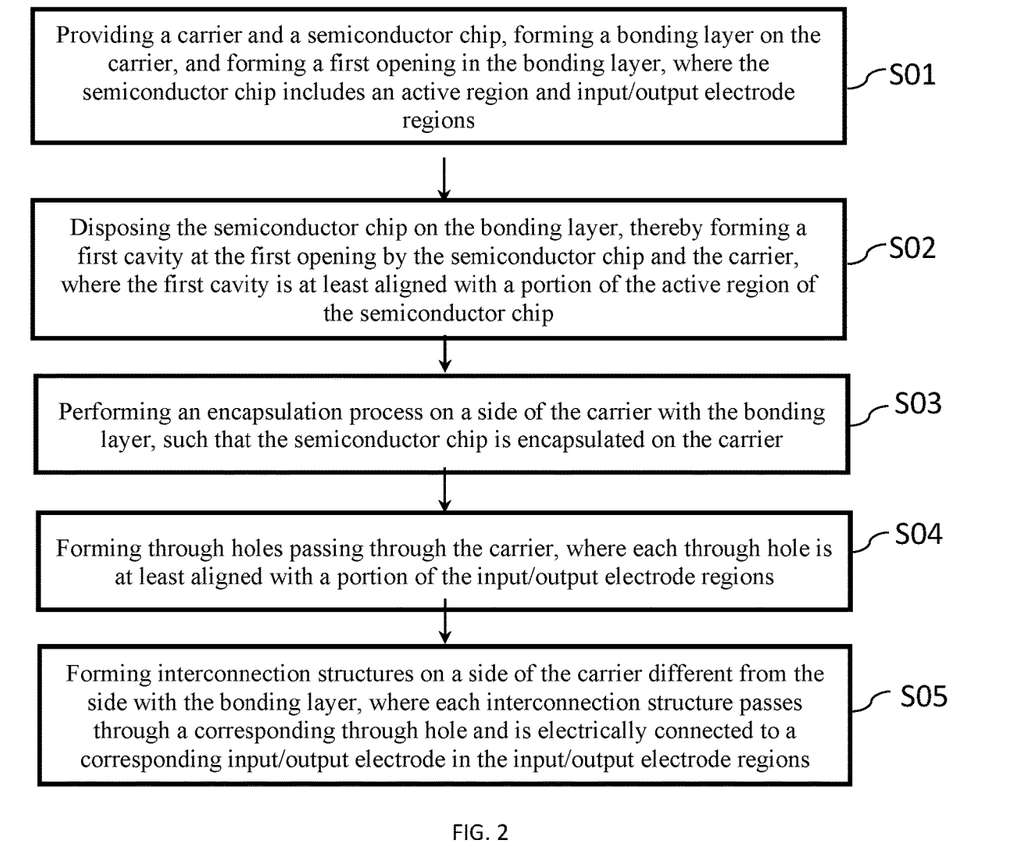
FIG. 2 illustrates a schematic flow chart of a method for fabricating an air gap type semiconductor device package structure according to various disclosed embodiments of the present disclosure.

FIG. 2 illustrates a schematic flow chart of a method for fabricating an air gap type semiconductor device package structure according to various disclosed embodiments of the present disclosure. As shown in FIG. 2, the method for fabricating the air gap type semiconductor device package structure according to various disclosed embodiments of the present disclosure may include the following steps:

S01, providing a carrier and a semiconductor chip, forming a bonding layer on the carrier, and forming a first opening in the bonding layer, where the semiconductor chip may include an active region and input/output electrode regions;

S02, disposing the semiconductor chip on the bonding layer, thereby forming a first cavity at the first opening by the semiconductor chip and the carrier, where the first cavity may be at least aligned with a portion of the active region of the semiconductor chip;

S03, performing an encapsulation process on a side of the carrier with the fixed semiconductor chip, such that the semiconductor chip may be encapsulated on the carrier;

S04, forming through holes passing through the carrier, where each through hole may be at least aligned with a portion of the input/output electrode regions; and S05, forming interconnection structures on a side of the carrier which is different from a side with the bonding layer, where each interconnection structure may pass through a corresponding through hole and be electrically connected to a corresponding input/output electrode of the input/output electrode regions.

FIGS. 3-16 illustrate structural schematics corresponding to steps of a method for fabricating an air gap type semiconductor device package structure according to various disclosed embodiments of the present disclosure. It should be noted that the package of the air gap type semiconductor device in one embodiment may be a wafer-level package. The method for fabricating the air gap type semiconductor device package structure according to various disclosed embodiments of the present disclosure may be described in detail with reference to FIG. 2 and FIGS. 3-16 hereinafter.

Firstly, the step S01 may be performed by providing a carrier 100 and a semiconductor chip 200. The carrier 100 may be made of silicon, silicon dioxide, ceramics, glass, organic materials, or the like. The carrier 100 may be a wafer in one embodiment. Exemplarily, the substrate material selected for the wafer may be at least one of the following materials including Si, Ge, SiGe, SiC, SiGeC, InAs, GaAs, InP, or other III/V compounds. The semiconductor substrate may further include a multiple layer structure of the above-mentioned materials, or may be a silicon-on-insulator (SOI), a strained-silicon-on-insulator (SSOI), a strained-silicon-germanium-on-insulator (S-SiGeOI), a silicon-germanium-on-insulator (SiGeOI) and germanium-on-insulator (GeOI).

Figure 7A:
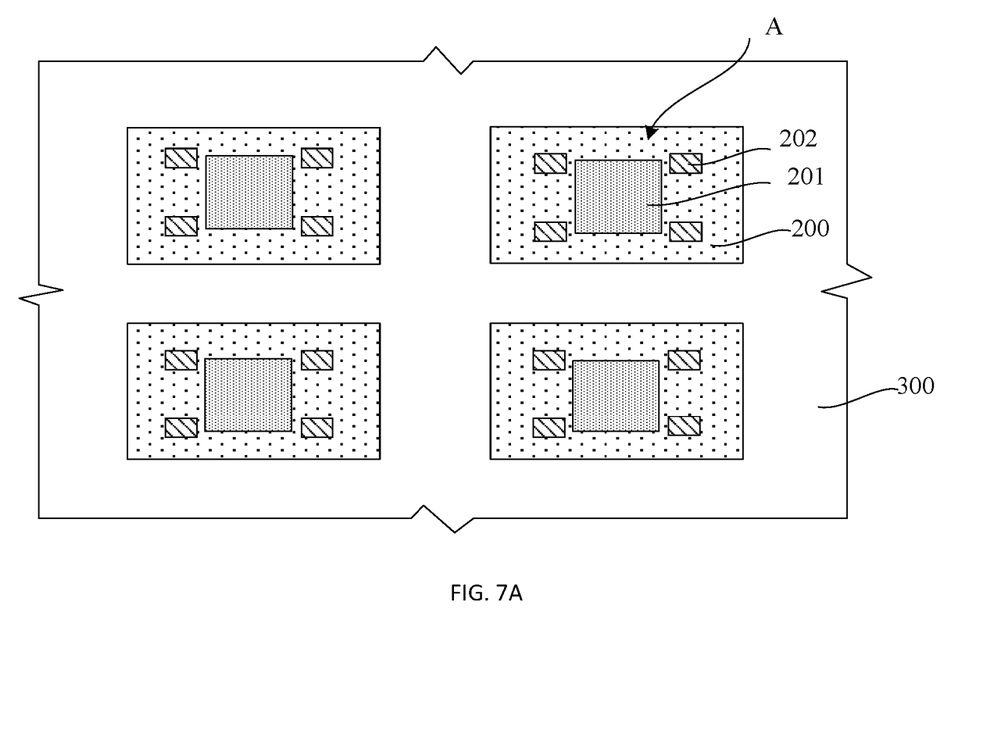
FIG. 7A illustrates a top view of a wafer including a plurality of semiconductor chips in a method for fabricating an air gap type semiconductor device package structure according to various disclosed embodiments of the present disclosure.
Figure 7B:
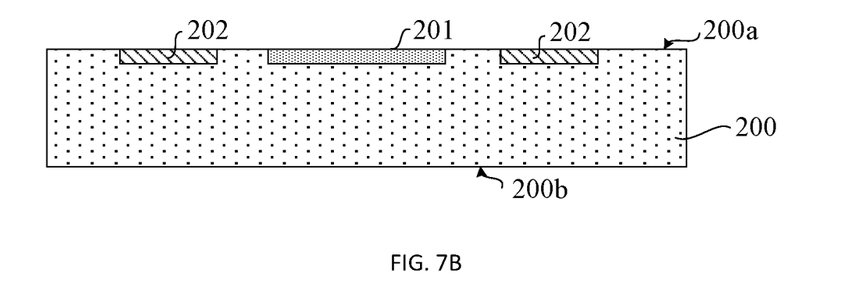
FIG. 7B illustrates a structural schematic of a semiconductor chip A in FIG. 7A.

FIG. 7A illustrates a top view of a wafer 300 including a plurality of semiconductor chips 200; and FIG. 7B illustrates a cross-sectional structural schematic of a semiconductor chip A in FIG. 7A. As shown in FIG. 7A and FIG. 7B, the semiconductor chip 200 may have a functional surface 200a and a non-functional surface 200b, which are opposite to each other. The functional surface 200a of the semiconductor chip 200 may include an active region 201 and input/output (I/O contact) regions 202. The semiconductor chip 200 may be a filter chip, a MEMS chip, an image sensor chip, or a biosensor chip. For example, the filter chip may be a surface acoustic wave (SAW) filter chip or a bulk acoustic wave (BAW) filter chip, which may not be limited according to various disclosed embodiments of the present disclosure. In one embodiment, the method for fabricating the air gap type semiconductor device package structure according to various disclosed embodiments of the present disclosure may be described using the exemplary packaging of the surface acoustic wave filter chip. The surface acoustic wave is an acoustic wave propagating in a limited depth of an object surface and along a solid-air interface; and the surface acoustic wave is a propagating elastic wave where energy may concentrate on the surface of a medium. The bulk acoustic wave may utilize that a bulk acoustic signal may be reflected at an interface between two electrodes and air when propagating in different media, and the bulk acoustic wave may form an air cavity with a surface of the carrier, which may confine the acoustic wave in the piezoelectric oscillation cavity. Therefore, for the surface acoustic wave and the bulk acoustic wave, it is necessary to form a closed cavity at the interface with the carrier, which may confine the propagation path of the acoustic wave. In one embodiment, the semiconductor chip 200 may be the SAW filter chip. For the SAW filter chip, it is necessary to form the cavity over the active region 201 of the functional surface 200a of the filter chip to protect the active region, which may confine the acoustic wave in the piezoelectric oscillation cavity. In one embodiment, the active region 201 may include a region configuring with the interdigital transducer (IDT). Input/output electrodes may be formed in the input/output electrode regions 202, and the input/output electrodes may be electrically connected to the interdigital transducer of the active region 201. The input/output electrode regions 202 may be, for example, located around the active region 201. For example, as shown in FIG. 7A, the semiconductor chip 200 may overall be a square, and the active region 201 may also overall be a square. The input/output electrode regions 202 may be located at four corners of the active region 201.

Next, as shown in FIGS. 3-6, a bonding layer 101 may be formed on the carrier 100. The bonding layer 101 formed on the carrier 100 may have a one-to-one correspondence with the semiconductor chip 200 on the wafer 300. In one embodiment, a filter chip on the wafer 300 may be used as an example for illustration. The material of the bonding layer may be patterned and have a certain adhesive force. In one embodiment, the bonding layer may be a patterned dry film layer. The material of the dry film layer may be, for example, a viscous photoresist film used in semiconductor chip packaging or printed circuit board manufacturing and may be a photosensitive polymer material including polyimide (PI), bis-benzocyclobutene (BCB), and p-phenylene-2,6-benzobis oxazole (PBO). The fabrication process of the patterned dry film layer may include, for example, the following: attaching the photoresist film on a surface of the carrier 100, and firmly pressing the photoresist film on the carrier 100 by a roller; next, baking the photoresist film; next performing the exposure and development treatment on the photoresist film to remove the photoresist in the unexposed region and form an opening on the carrier 100; next, performing a hardening treatment on the developed photoresist to enhance the adhesion between the photoresist film and the carrier 100; and finally forming the pattern dry film layer, that is, the bonding layer 101, on the carrier 100. A first opening 110' formed in the bonding layer 101 may correspond to the active region 201 of the semiconductor chip 200, so a first cavity 110 may be conveniently formed between the carrier 100 and the semiconductor chip 200 after the carrier 100 is aligned with the semiconductor chip 200.

Figure 3:
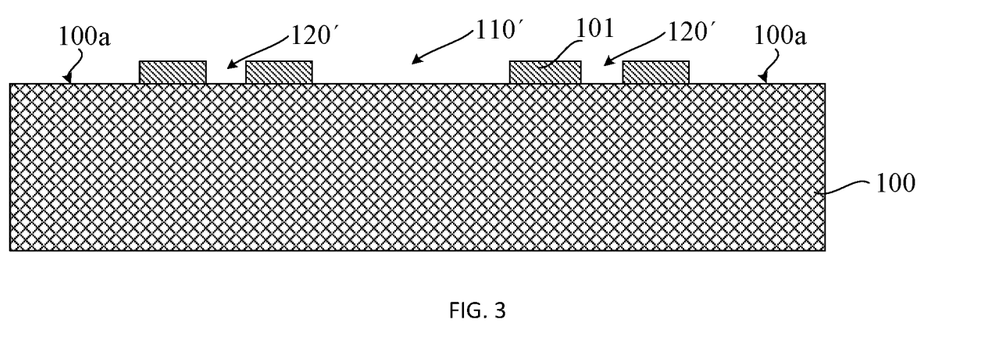
FIGS. 3-6 illustrate structural schematics of examples of semiconductor structures each having an exemplary bonding layer on a carrier, at a certain stage during fabrication of an air gap type semiconductor device package structure according to various disclosed embodiments of the present disclosure.
Figure 4:
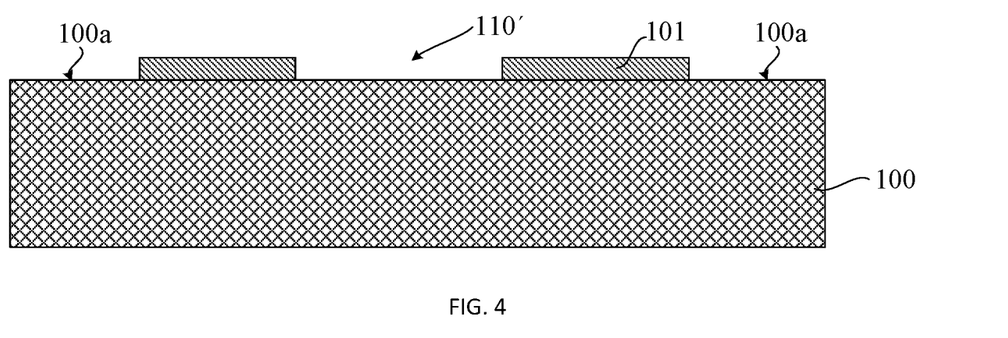
Figure 5:
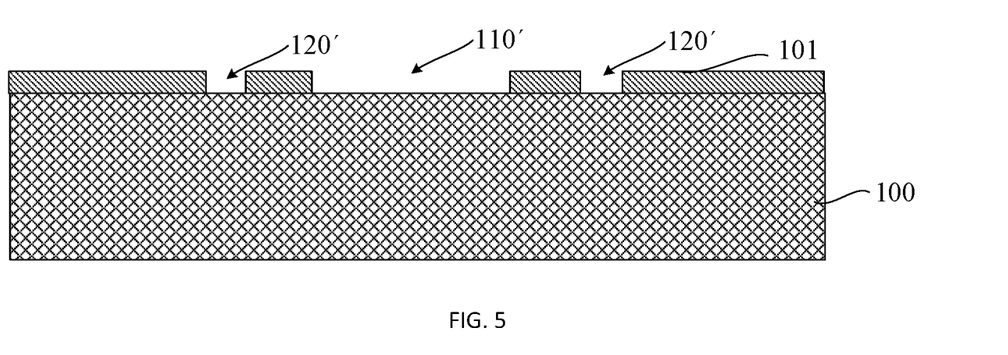
Figure 6:
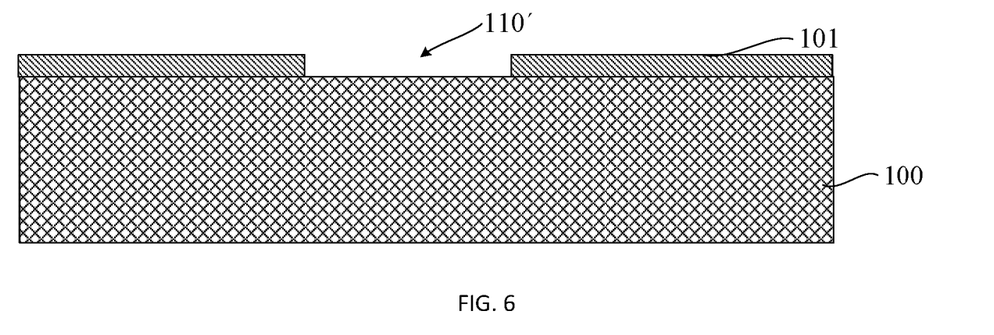
Figure 8A:
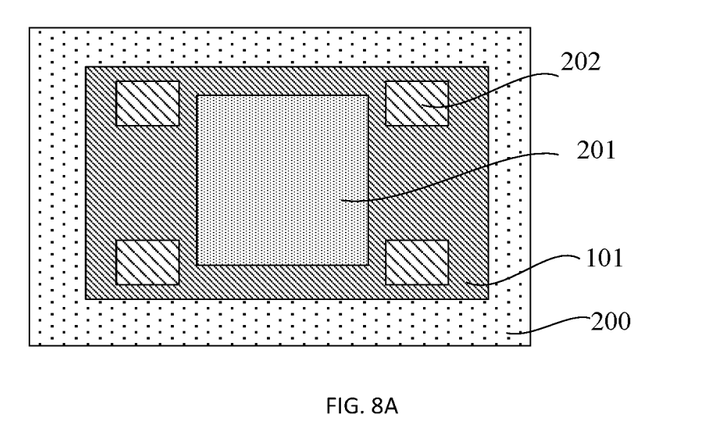
Figure 8B:
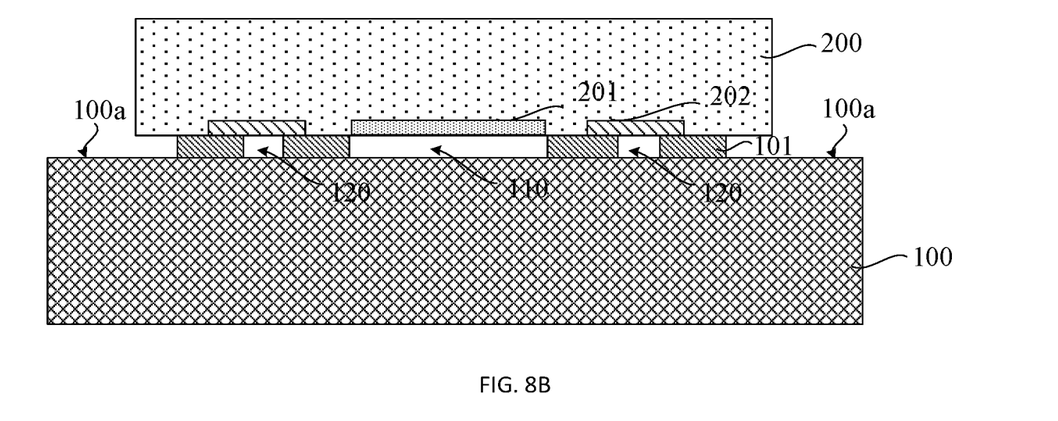
Figure 10A:
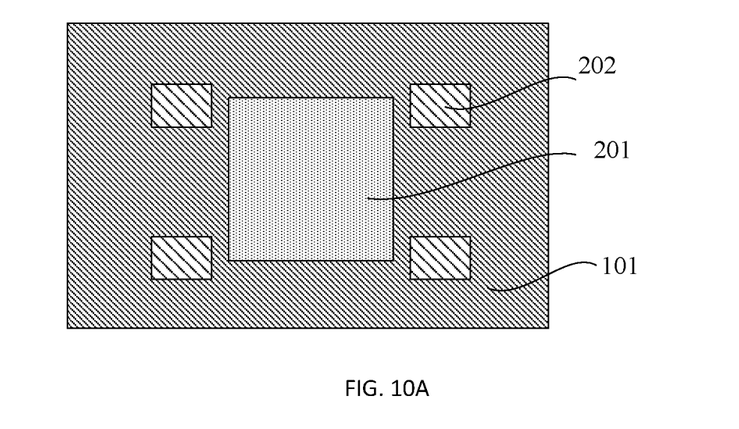
Figure 10B:
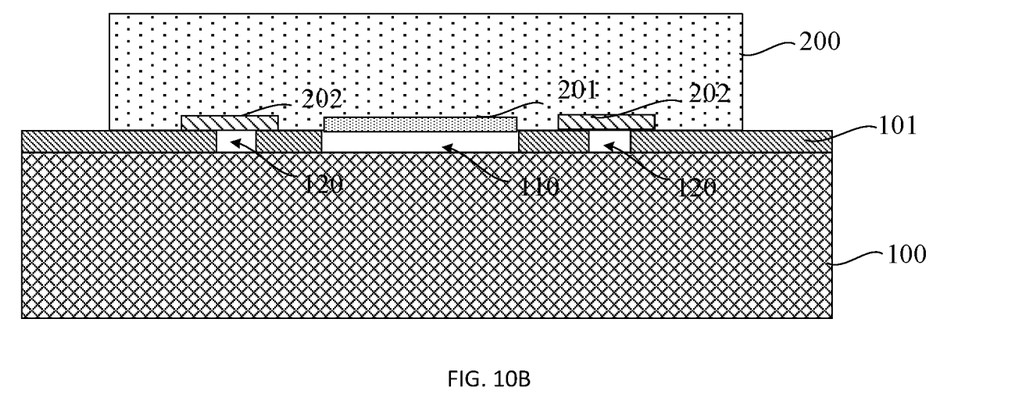

In one embodiment, the first opening 110' may be formed in the bonding layer 101 corresponding to the active region 201 of the semiconductor chip 200. Other regions of the carrier 100 may be covered by the bonding layer 101. In actual implementation, the bonding layer 101 may also be designed to only cover preset regions other than the active region 201 according to actual process requirements. For example, a second opening 120' may be formed at a region of the bonding layer 101 corresponding to the input/output electrode region 202 of the semiconductor chip 200. That is, after the semiconductor chip 200 is disposed on the bonding layer 101, a second cavity 120 may be formed at the input/output electrode region 202, as shown in FIG. 8B and FIG. 10B, which may be convenient to subsequently form a through hole 103 passing through the carrier 100 and the bonding layer 101. Or, under the premise of ensuring the adhesion between the carrier 100 and the semiconductor chip 200, the bonding layer 101 may cover a relatively small region of the carrier 100. For example, as shown in FIG. 3, when forming the first opening 110' and the second opening 120', the bonding layer 101 may also expose edge regions 100a of the carrier 100. For another example, as shown in FIG. 4, when forming the first opening 110', the bonding layer 101 may expose the edge regions 100a of the carrier 100. The additional exposure of the edge regions 100a of the carrier 100 may facilitate subsequent formation of an encapsulation layer 102, so the encapsulation layer 102 may cover the exposed carrier 100, and the exposed bonding layer 101 and the semiconductor chip 200, and may encapsulate the bonding layer 101 and the semiconductor chip 200 to achieve a desirable encapsulation effect.

It can be understood that, in other embodiments of the present disclosure, the bonding layer 101 may also be formed on the semiconductor chip 200, and then the semiconductor chip 200 with the bonding layer may be bonded to the carrier 100. For example, the bonding layer 101 may be formed on the wafer 300 having the plurality of the semiconductor chips 200, and the first opening 110' may be formed in the bonding layer 101 to expose the active region 201 in the semiconductor chip 200, so the first cavity 110 may be conveniently formed between the carrier 100 and the semiconductor chip 200 after the carrier 100 is aligned with the semiconductor chip 200. Of course, the second opening 120' may be formed at the region of the bonding layer 101 corresponding to the input/output electrode region 202 of the semiconductor chip 200. After the semiconductor chip 200 is disposed on the bonding layer 101, the second cavity 120 may be formed at the input/output electrode region 202, which may be convenient to subsequently form the through hole 103 passing through the carrier 100 and the bonding layer 101. Or, under the premise of ensuring the adhesion between the carrier 100 and the semiconductor chip 200, the bonding layer 101 may cover a relatively small region of the carrier 100. For example, when forming the first opening 110' and the second openings 120', the bonding layer 101 may also expose edge regions of the semiconductor chip 200. For another example, when forming the first opening 110', the bonding layer 101 may expose edge regions of the semiconductor chip 200. The additional exposure of the edge regions of the semiconductor chip 200 may facilitate the subsequent formation of the encapsulation layer 102, so the encapsulation layer 102 may cover the exposed carrier 100, and the exposed bonding layer 101 and the semiconductor chip 200, and may encapsulate the bonding layer 101 and the semiconductor chip 200 to achieve a desirable encapsulation effect.

In one embodiment, a thickness of the bonding layer 101 may directly determine a thickness of the first cavity 110 formed subsequently, and the thickness of the first cavity 110 may be related to the resonant frequency of the filter. Therefore, the thickness of the bonding layer 101 may be determined according to the required resonant frequency of the filter. Exemplarily, the thickness of the bonding layer 101 may be around 2 μm to around 200 μm, such as 50 μm, 80 μm or 100 μm.

Figure 9A:
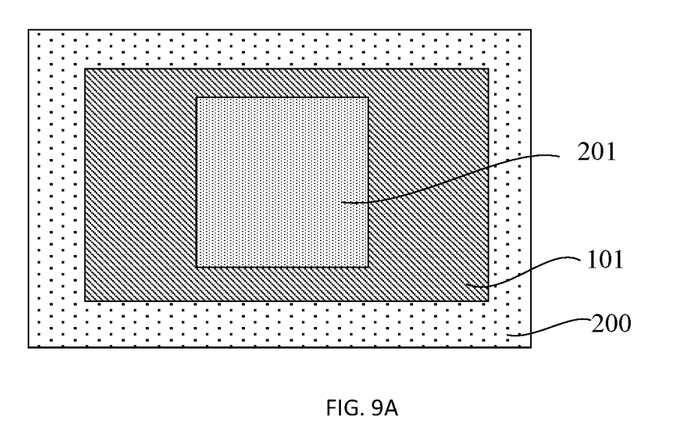
Figure 9B:
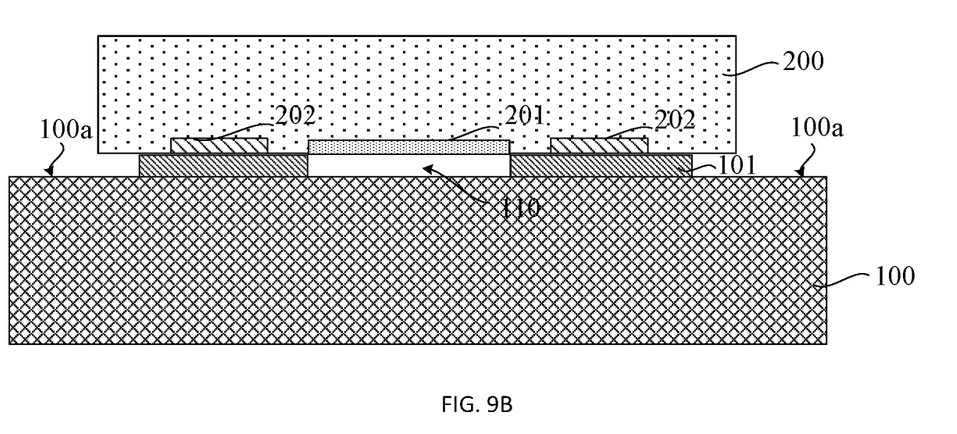
Figure 11A:
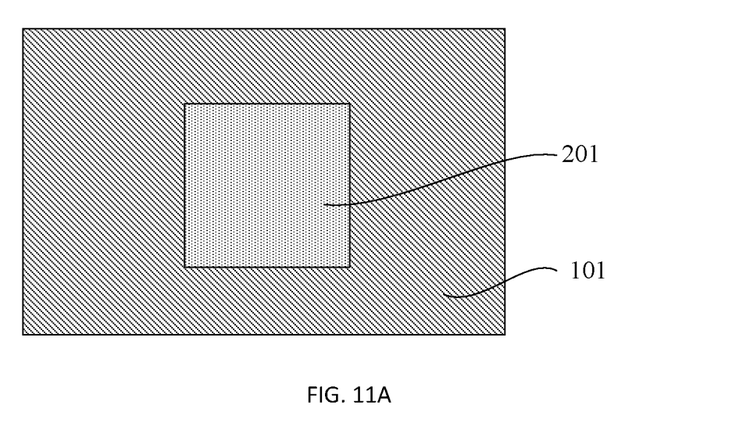
Figure 11B:
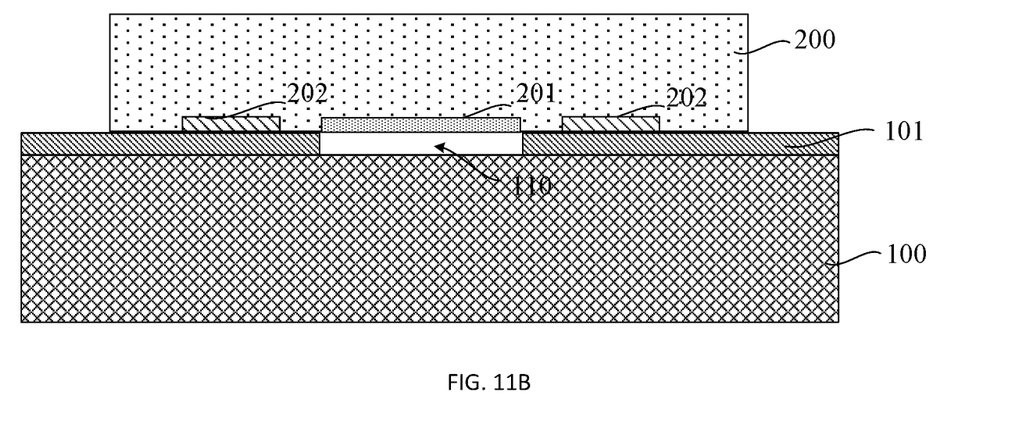

Next, step S02 may be performed by disposing the semiconductor chip 200 on the bonding layer 101 and thereby forming the first cavity 110 at the first opening 110', where the first cavity 110 may be aligned with the active region 201 of the semiconductor chip 200. As shown in FIG. 11A and FIG. 11B, the first cavity may be formed only at the first opening 110'. As shown in FIG. 8A and FIG. 8B, the first cavity 110 may be formed at the first opening 110' and the second cavity 120 may be formed at the second opening 120' simultaneously during the actual implementation. The second cavity 120 may be aligned with the input/output electrode region 202 of the semiconductor chip 200, and the edge regions 100a of the carrier 100 may also be exposed. Or, as shown in FIG. 9A and FIG. 9B, the first cavity 110 may be formed only at the first opening 110' and the edge regions 100a of the carrier 100 may be also exposed simultaneously. Or, as shown in FIG. 10A and FIG. 10B, the first cavity 110 may be formed at the first opening 110' and the second cavity 120 may be formed at the second opening 120' simultaneously, and the edge regions 100a of the carrier 100 may be covered by the bonding layer 101.

In one embodiment, by directly mounting the semiconductor chip 200 on the carrier 100 through the bonding layer 101, the encapsulation material may be blocked from entering the active region 201 of the semiconductor chip 200 during the subsequent encapsulation process, thereby avoiding the contamination of the active region 201.

Figure 12:
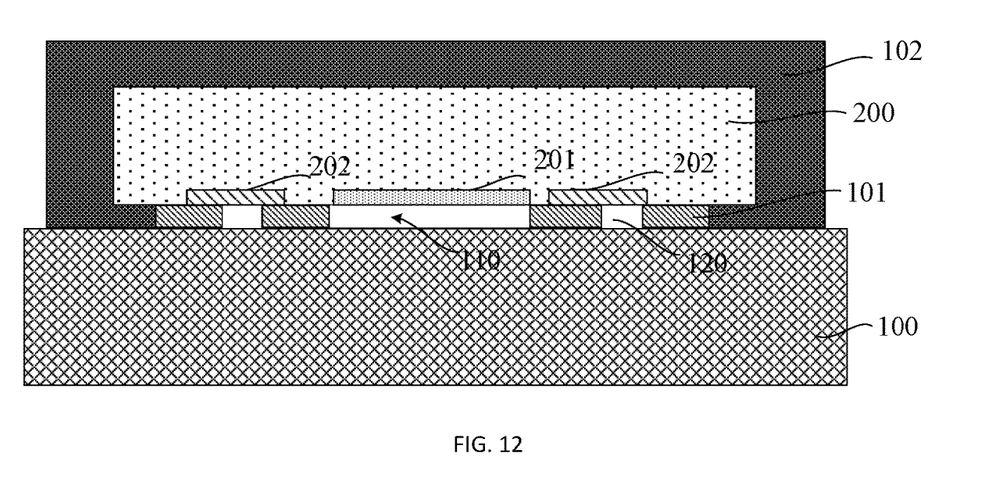
FIG. 12 illustrates a structural schematic of a semiconductor structure after forming an encapsulation layer in a method for fabricating an air gap type semiconductor device package structure according to various disclosed embodiments of the present disclosure.

In one embodiment, an area of the first cavity 110 may be equal to an area of the active region 201 of the semiconductor chip 200, where both areas may be completely aligned. However, during the actual implementation, the area of the first cavity 110 may also be different from the area of the active region 201, as long as the first cavity 110 may face toward the active region 201 of the semiconductor chip 200 and the projection of the active region 201 of the semiconductor chip 200 may be at least partially within the first cavity 110. Similarly, an area of the second cavity 120 may or may not be equal to an area of the input/output electrode region 202 of the semiconductor chip 200. FIG. 12 may show that the area of the input/output electrode region 202 is larger than the area of the second cavity 120, as long as the second cavity 120 may face toward the input/output electrode region 202 and the projection of the input/output electrode region 202 may be at least partially within the second cavity 120. Preferably, the second cavity 120 may be aligned with a central region of the input/output electrode region 202.

For the remaining steps of the method for fabricating the air gap type semiconductor device package structure, the bonding layer 101 shown in FIG. 12 may only be used for illustration in one embodiment. For other disposed shapes of the bonding layer 101, the process of the remaining steps may be the same, which is not be described herein.

Next, step S03 may be performed for performing an encapsulation process on a side of the carrier 100 with the attached semiconductor chip 200, such that the semiconductor chip 200 may be encapsulated on the carrier 100. For example, as shown in FIG. 12, an injection molding process may be performed on the carrier 100 to form the encapsulation layer 102 on the side of the carrier 100 with the attached semiconductor chip 200. The encapsulation layer 102 may encapsulate the semiconductor chip 200 and the bonding layer 101. The encapsulation layer 102 may be fabricated with any heat-fusible resin materials which may include thermoplastic resin such as polycarbonate (PC), polyethylene terephthalate (PET), polyether sulfone, polyphenylene ether, polyamide, polyetherimide, methacrylic resin, or cyclic polyolefin resin. In the embodiments of the present disclosure, the encapsulation layer 102 may be fabricated with epoxy resin. For example, the encapsulation layer 102 may be formed by a hot press injection molding process having a desirable filling performance, so an injection molding agent may be better filled on the carrier 100 and encapsulate the semiconductor chip 200, thereby having a desirable packaging effect.

Figure 13:
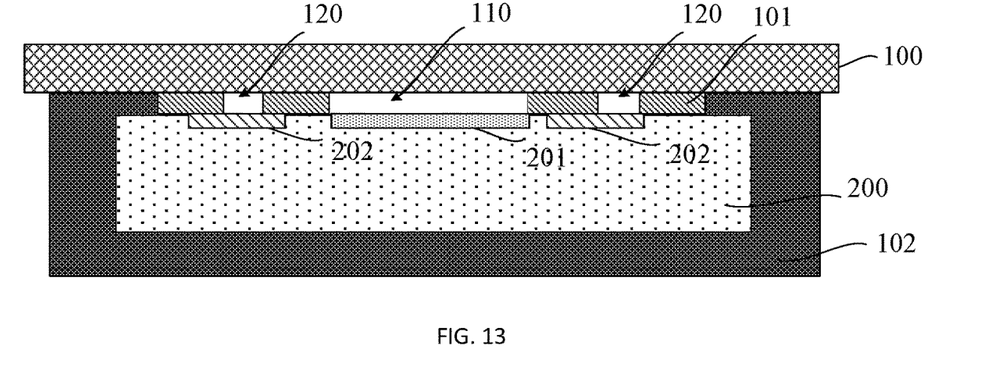
FIG. 13 illustrates a structural schematic of a semiconductor structure after thinning a back surface of the formed carrier in a method for fabricating an air gap type semiconductor device package structure according to various disclosed embodiments of the present disclosure.
Figure 14:
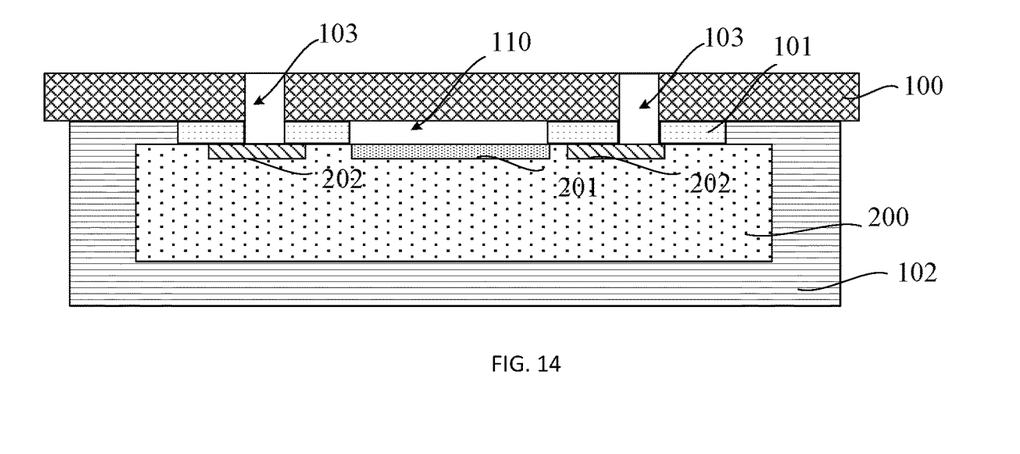
FIG. 14 illustrates a structural schematic of a semiconductor structure after forming through holes in a method for fabricating an air gap type semiconductor device package structure according to various disclosed embodiments of the present disclosure.

Next, step S04 may be performed for forming through holes 103 passing through the carrier 100 and the bonding layer 101 at the position aligned with the input/output electrode regions 202 of the semiconductor chip 200, as shown in FIG. 14. The through holes 103 may be formed by a process including etching, laser or mechanical drilling. The through holes 103 may pass through the carrier 100 and the bonding layer 101 to the input/output electrode regions 202. In a preferred embodiment, after forming the through holes 103, the through holes 103 may be cleaned. For example, the through holes 103 may be cleaned by a reactive ion etching (RIE) method to facilitate the subsequent formation of the interconnection structures. In another embodiment of the present disclosure, before forming the through holes 103, as shown in FIG. 13, the carrier 100 may be firstly inverted, and then a thinning process may be performed on the carrier 100. For example, a side of the carrier 100 different from the side with the bonding layer 101 may be thinned by one or more of a chemical mechanical polishing process (CMP), a wet etching process, or a dry etching process, thereby facilitating the formation of the through holes 103.

Figure 15:
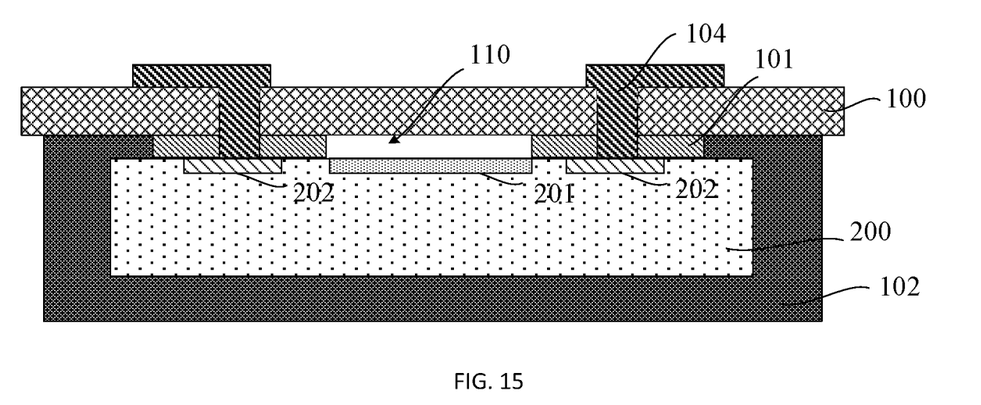
FIG. 15 illustrates a structural schematic of a semiconductor structure after forming interconnecting structures in a method for fabricating an air gap type semiconductor device package structure according to various disclosed embodiments of the present disclosure.

Next, as shown in FIG. 15, step S05 may be performed by forming interconnection structures 104 on the side of the carrier 100 different from the side with the bonding layer 101, where each interconnection structure 104 may pass through a corresponding through hole 103 and be electrically connected to a corresponding input/output electrode of the input/output electrode region 202. Exemplarily, the interconnection structure 104 may be formed by using a metal plug and a metal wiring. For example, the metal plug may be formed in the through hole 103, and the metal wiring may be formed on the side of the carrier 100 different from the side with the bonding layer 101. The interconnection structure 104 may be formed by the following: forming a metal layer which may fill the through hole 103 and cover the surface of the carrier 100 by a process including metal pressing, electroplating or deposition, and patterning the metal layer by a process including photolithography, etching, or the like to form the interconnection structure 104, thereby implementing the lead-out of the input/output electrode region 202. The interconnection structure 104 may be made of a material including one or an alloy of gold, silver, copper, iron, aluminum, nickel, palladium, or tin.

Figure 16:
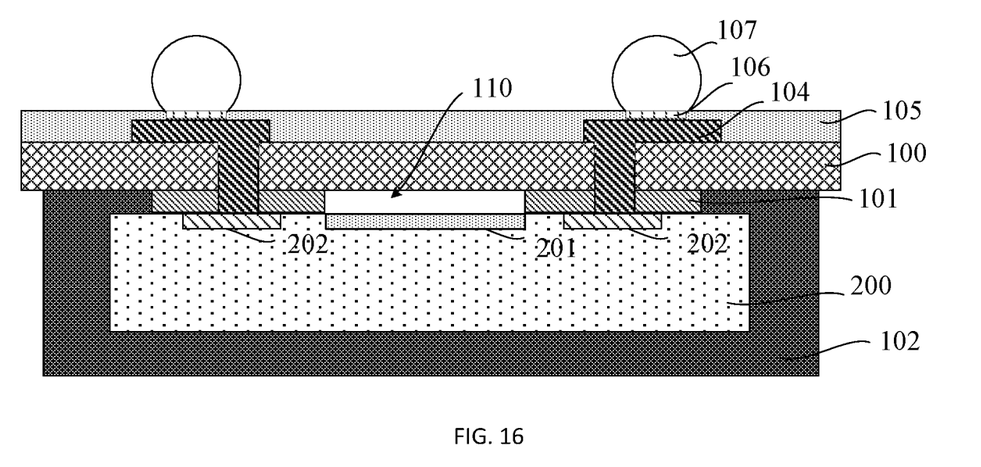
FIG. 16 illustrates a structural schematic of an air gap type semiconductor device package structure according to various disclosed embodiments of the present disclosure.

In one embodiment, after forming the interconnection structures 104, the method may further include: form a passivation layer 105 on the side of the carrier 100 different from the side with the bonding layer 101, where the passivation layer 105 may cover the interconnection structures 104 and the side of the carrier 100 different from the side with the bonding layer 101; next, forming passivation layer openings in the passivation layer 105 to expose the interconnection structures 104 by a process including photolithography and etching, and filling the passivation layer openings with a metal material to form an under-bump-metallurgy (UBM) layer 106; next, forming solder bumps 107 by reflow soldering on the under-bump-metallurgy layer 106, as shown in FIG. 16. The solder bumps 107 may be made of, for example, a material including one or an alloy of a metal such as tin, lead, copper, silver, and gold.

Finally, the air gap type semiconductor device package structure may be diced into a plurality of the semiconductor devices.

Correspondingly, the present disclosure also provides a package structure of the air gap type semiconductor device, including:
- a carrier 100;
- a semiconductor chip 200 including an active region 201 and input/output electrode regions 202;
- a bonding layer 101, where the bonding layer 101 may be disposed between the carrier 100 and the semiconductor chip 200; the bonding layer 101 may have a first opening 110'; a first cavity 110 may be formed at the first opening 110' by the semiconductor chip 200 and the carrier 100; the first cavity 110 may be at least aligned with a portion of the active region 201 of the semiconductor chip;
- an encapsulation layer 102, where the encapsulation layer 102 and the bonding layer 101 may be on the same side of the carrier 100, and the encapsulation layer 102 may encapsulate and cover the semiconductor chip 200 and the exposed region of the bonding layer 101;
- at least one through hole 103, where the through hole 103 may pass through the carrier 100, and at least expose a portion of the input/output electrode regions 202 of the semiconductor chip 200; and
- an interconnection structures 104 forming on the side of the carrier 100 different from the side with the bonding layer 101, where each interconnection structure 104 may pass through the corresponding through hole 103 and be electrically connected to the corresponding input/output electrode in the input/output electrode region 202.

The carrier 100 may be made of silicon, silicon dioxide, ceramics, glass, organic materials, or the like. The carrier 100 may be a wafer in one embodiment. The material of the bonding layer may be patterned and have a certain adhesive force. The semiconductor chip 200 may be a filter chip, a MEMS chip, an image sensor chip, or a biosensor chip. For example, the filter chip may be a surface acoustic wave (SAW) filter chip or a bulk acoustic wave (BAW) filter chip. In one embodiment, the bonding layer 101 may be a patterned dry film layer. The material of the dry film layer may be, for example, a viscous photoresist film used in semiconductor chip packaging or printed circuit board manufacturing and may be a photosensitive polymer material. The encapsulation layer 102 may be made of epoxy resin. The interconnection structures 104 may be made of a material including one or an alloy of gold, silver, copper, iron, aluminum, nickel, palladium, or tin.

The area of the first cavity 110 may be equal to the area of the active region 201 of the semiconductor chip 200, where both areas may be completely aligned. However, during the implementation, the area of the first cavity 110 may also be different from the area of the active region 201, as long as the first cavity 110 may face the active region 201 of the semiconductor chip 200 and the projection of the active region 201 of the semiconductor chip 200 may be at least partially within the first cavity 110.

The bonding layer 101 may further have the second opening 120'. The second cavity 120 may be formed at the second opening 120' by the semiconductor chip and the carrier 100. The second cavity 120 may be at least aligned with a portion of the input/output electrode regions 202. The second cavity 120 may be connected to the through hole 103. The interconnection structure 104 may pass through the through hole 103 and the second cavity 120 and be electrically connected to the input/output electrode. In other embodiments of the present disclosure, the bonding layer 101 may not have the second opening 120', and the through hole 103 may be formed subsequently by etching the carrier 100 and the bonding layer 101, thereby exposing the input/output electrode of the input/output electrode region 202; next, a metal plug may be formed in the through hole 103, and the metal wiring may be performed on the side of the carrier 100 different from the side with the bonding layer 101, thereby forming the interconnection structure 104.

Furthermore, the passivation layer 105 may be disposed on the side of the carrier 100 different from the side with the bonding layer 101, where the passivation layer 105 may cover the interconnection structures 104 and the side of the carrier 100 different from the side with the bonding layer 101. The under-bump-metallurgy (UBM) layer 106 may be formed on the passivation layer 105. The solder bumps 107 may be formed by reflow soldering on the under-bump-metallurgy layer 106. The solder bumps 107 may be connected to the interconnection structures 104 through the under-bump-metallurgy layer 106, and further be connected to the input/output electrode regions 202 of the semiconductor chip 200, thereby implementing electrical signal input and output.

The air gap type semiconductor device package structure may be fabricated by the wafer-level package, and then may be diced into a plurality of the semiconductor devices by a dicing process.

As disclosed, the technical solutions of the present disclosure have the following advantages.

The present disclosure provides the air gap type semiconductor device package structure and its fabrication method. The bonding layer having the first opening may be formed on the carrier. The first cavity may be formed at the first opening by disposing the semiconductor chip on the bonding layer. The first cavity may be at least aligned with a portion of the active region of the semiconductor chip to form an air gap which may provide a cavity working environment for the active region. Then, the semiconductor chip may be encapsulated on the carrier by the encapsulation process. Lastly, the through hole passing through the carrier may be formed at the position aligned with the input/output electrode region of the semiconductor chip, and the interconnection structures may be formed on the side of the carrier different from the side with the bonding layer, where each interconnection structure may pass through the corresponding through hole and be electrically connected to the corresponding input/output electrode of the input/output electrode region. The air gap type semiconductor device package structure provided by the disclosure may not require long pins and sealing of the upper cover to provide a cavity environment required for the active region, thereby reducing package volume and material cost.

It should be noted that various embodiments in the present specification are described in a related manner, and same or similar parts between various embodiments may be referred to each other. The emphasis of each embodiment is the part different from other embodiments. In particular, since structural embodiments are basically similar to method embodiments, the description of the structural embodiments may be relatively simple, and the relevant parts may be referred to the description of the method embodiments.

The above-mentioned description is merely for the description of the preferred embodiments of the present disclosure, and it not intended to limit the scope of the present disclosure. Any changes and modifications based on the above-mentioned embodiments made by those skilled in the art are all within the scope of the present disclosure.

What is claimed is:

1. A package structure of an air gap type semiconductor device, comprising:
   a carrier;
   a semiconductor chip;
   a bonding layer disposed between the carrier and the semiconductor chip, wherein a first cavity is formed in the bonding layer and enclosed by the semiconductor chip and the carrier, and the first cavity is at least aligned with a portion of an active region of the semiconductor chip;
   an encapsulation layer, wherein the encapsulation layer and the bonding layer are on a same side of the carrier, the encapsulation layer encapsulates the semiconductor chip and an exposed region of the bonding layer, and at least one portion of the encapsulation layer is formed between the semiconductor chip and the carrier along a direction perpendicular to a lateral surface of the carrier;
   at least one through hole, wherein the through hole passes through the carrier, and at least exposes a portion of the input/output electrode regions; and
   interconnection structures formed on a side of the carrier different from a side with the bonding layer, wherein each interconnection structure passes through a corresponding through hole and is electrically connected to a corresponding input/output electrode in the input/output electrode regions.

2. The package structure according to claim 1, wherein:
   a second cavity is formed in the bonding layer and enclosed by the semiconductor chip and the carrier; and
   the second cavity is at least aligned with a portion of the input/output electrode regions.

3. The package structure according to claim 1, wherein:
   the bonding layer further exposes edge regions of the semiconductor chip, and
   the at least one portion of the encapsulation layer envelops the edge regions of the semiconductor chip.

4. The package structure according to claim 1, wherein:
   the carrier is a wafer.

5. The package structure according to claim 1, wherein:
   the semiconductor chip includes at least one of a filter chip, a microelectromechanical systems (MEMS) chip, an image sensor, or a biosensor chip.

6. The package structure according to claim 1, further including:
   a passivation layer on the side of the carrier different from the side with the bonding layer, wherein the passivation layer covers the interconnection structures and the passivation layer contains openings;
   an under-bump-metallurgy layer electrically connected to the interconnection structures, in the openings of the passivation layer; and
   solder bumps on the under-bump-metallurgy layer.

7. The package structure according to claim 1, wherein:
   the interconnection structures are made of a material including gold, silver, copper, iron, aluminum, nickel, palladium, tin, or a combination thereof.

8. An air gap type semiconductor device, comprising:
   the air gap type semiconductor device package structure according to claim 1.

9. A package structure of an air gap type semiconductor device, comprising:
   a carrier, a semiconductor chip, and a bonding layer between the carrier and the semiconductor chip, wherein
   a first cavity and a second cavity are provided in the bonding layer and each between the carrier and the semiconductor chip,
   the first cavity is at least aligned with a portion of an active region of the semiconductor chip, and
   the second cavity is at least aligned with a portion of an input/output electrode region;
   an encapsulation layer encapsulating the semiconductor chip on the carrier;
   a through hole passing through the carrier and connecting to the second cavity; and
   an interconnection structure in the through hole and the second cavity, and connected to the input/output electrode region.

10. The package structure according to claim 9, wherein:
    at least one portion of the encapsulation layer is formed between the semiconductor chip and the carrier along a direction perpendicular to a lateral surface of the carrier.

11. The package structure according to claim 9, wherein:
    the bonding layer further expose edge regions of the semiconductor chip, and
    the at least one portion of the encapsulation layer envelops the edge regions of the semiconductor chip.

12. The package structure according to claim 9, wherein:
    the carrier is a wafer.

13. The package structure according to claim 9, wherein:
    the semiconductor chip includes at least one of a filter chip, a microelectromechanical systems (MEMS) chip, an image sensor, or a biosensor chip.

14. The package structure according to claim 9, further including:
    a passivation layer on the side of the carrier different from the side with the bonding layer, wherein the passivation layer covers the interconnection structures and the passivation layer contains openings;
    an under-bump-metallurgy layer electrically connected to the interconnection structures, in the openings of the passivation layer; and
    solder bumps on the under-bump-metallurgy layer.

15. The package structure according to claim 9, wherein:
    the interconnection structures are made of a material including gold, silver, copper, iron, aluminum, nickel, palladium, tin, or a combination thereof.

16. An air gap type semiconductor device, comprising:
the air gap type semiconductor device package structure according to claim 9.

* * * * *